(12) United States Patent
Philippsen et al.

(10) Patent No.: US 8,169,084 B2
(45) Date of Patent: May 1, 2012

(54) BOND PAD STRUCTURE AND METHOD FOR PRODUCING SAME

(75) Inventors: Bengt Philippsen, Hamburg (DE); Hans-Joerg Klammer, Hamburg (DE)

(73) Assignee: NXP B.V., Eindhoven (NL)

( * ) Notice: Subject to any disclaimer, the term of this patent is extended or adjusted under 35 U.S.C. 154(b) by 205 days.

(21) Appl. No.: 12/514,269

(22) PCT Filed: Nov. 12, 2007

(86) PCT No.: PCT/IB2007/054591
§ 371 (c)(1),
(2), (4) Date: May 8, 2009

(87) PCT Pub. No.: WO2008/059433
PCT Pub. Date: May 22, 2008

(65) Prior Publication Data
US 2010/0032848 A1    Feb. 11, 2010

(30) Foreign Application Priority Data
Nov. 13, 2006  (EP) ..................... 06123956

(51) Int. Cl.
*H01L 29/41* (2006.01)

(52) U.S. Cl. . 257/781; 257/758; 257/777; 257/E23.015; 257/E23.019; 257/E23.021; 438/612; 438/652; 438/665; 438/666

(58) Field of Classification Search ............... 257/779, 257/782, 778, 786, 731, 733, E21.504, E23.019, 257/750, 758, 773, 781, E23.01, E23.011, 257/E23.012, E23.015, E23.02, E23.021; 438/612, 666, 108, 584, 614, 652, 665
See application file for complete search history.

(56) References Cited

U.S. PATENT DOCUMENTS

| 5,393,701 | A | 2/1995 | Ko et al. | |
| 5,869,357 | A | 2/1999 | Zambrano | |
| 6,545,355 | B2* | 4/2003 | Yanagida | ...................... 257/738 |
| 6,914,333 | B2* | 7/2005 | Lo et al. | ........................ 257/737 |
| 2001/0010404 | A1 | 8/2001 | Ker et al. | |
| 2003/0030153 | A1 | 2/2003 | Perry | |
| 2003/0109079 | A1 | 6/2003 | Yamaguchi et al. | |
| 2004/0043538 | A1 | 3/2004 | Lo et al. | |
| 2005/0258484 | A1 | 11/2005 | Itou | |
| 2006/0076679 | A1* | 4/2006 | Batchelor et al. | ............. 257/737 |

FOREIGN PATENT DOCUMENTS

| EP | 632497 A2 | 1/1995 |
| EP | 1 429 582 A2 | 6/2004 |
| FR | 2 510 307 A | 1/1983 |

\* cited by examiner

*Primary Examiner* — Evan Pert
*Assistant Examiner* — Eduardo A Rodela

(57) ABSTRACT

It is described a bond pad structure and a method for producing the same, the bond pad structure (1), comprising: a substrate (3) having a surface (17) to be electrically contacted; a first isolator layer (5) contacting the surface (17) of the substrate in a first region (a); a first metal layer (9) contacting the surface (17) of the substrate (3) in a second region (b) adjacent the first region (a) and partly overlapping the first isolator layer (5); a second isolator layer (11) at least partly overlapping the first isolator layer (5) and the first metal layer (9); a second metal layer (13) at least partly overlapping the second isolator layer (11) in the second region (b); wherein a maximum thickness (U) of the second metal layer (13) perpendicular to the surface (17) of the substrate (3) is smaller than a maximum thickness (t0) of the first isolator layer (5) perpendicular to the surface (17) of the substrate (3). The surface of the second isolator layer forming the highest level provides scratching protection for the bond pad structure.

12 Claims, 2 Drawing Sheets

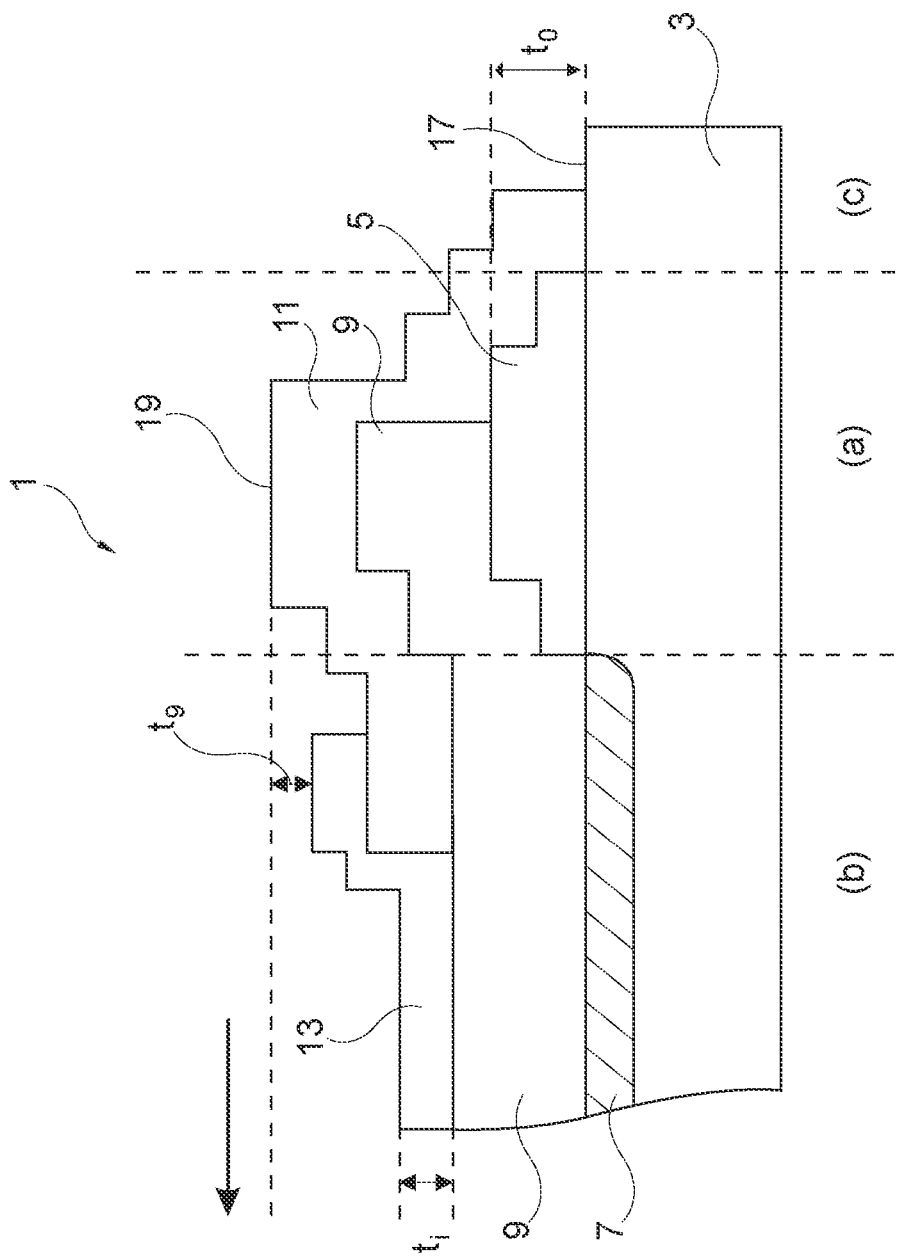

BOND PAD STRUCTURE AND METHOD FOR PRODUCING SAME

FIELD OF INVENTION

The present invention relates to the field of bond pads which can be used to soft solder metal clips on semiconductor devices and to a method for producing such bond pad structures.

In microelectronic devices specific areas on a chip have to be contacted via external metal clips for example. For this purpose, so-called bond pads can be provided on the surface of the chip. Bond pads are metallised areas on the surface of the chip which are in contact with underlying structures within the substrate forming the actual chip. The metallised areas can then be contacted with external wires such that the circuitry of the chip can be electrically contacted to an external circuit. For example, the wires can be soft soldered onto the bond pad.

FIG. 1 shows a prior art bond pad structure 101. A silicon wafer is used as a substrate 103 for a chip. In a first region of a surface of the silicon substrate 103 an oxide layer 105 is provided. In a second region adjacent to the first region a highly doped area 107 is provided within the silicon substrate. The surface of the silicon substrate in this second region is in contact with a first metal layer 109. The first metal layer not only contacts the highly doped area 107 but also partly overlaps the oxide layer 105. A silicon nitride layer 111 overlaps both the oxide layer 105 in the first region and the first metal layer 109 in the second region partly. This silicon nitride layer serves as a passivation against mobile ions and as a scratch protection of discrete semiconductors. Finally, a second metal layer 113 is provided on top of the first metal layer 109 and partly overlaps the silicon nitrite layer 111. Whereas the first metal layer 109 is provided for creating an Ohmic or Schottky contact to the silicon substrate 103, the second metal layer 113 is provided to achieve a good solderability of the bond pad.

In the conventional bond pad structure shown in FIG. 1, the second metal layer 113 lying upon the passivating silicon nitride layer 111 is not protected against mechanical scratching. This can lead to yield losses during wafer backside processing and handling of the assembly.

Furthermore, problems can occur during sputtering procedures for metallization of the backside of the silicon substrate 103. For example, the second metal layer forming the "highest" point of the bond pad structure can be in thermal contact with a chuck on which the substrate located during sputtering procedures. As the second metal layer 111 is a good thermal conductor, the substrate may not be heated sufficiently by a sputtering beam during the sputtering procedure as the produced heat is quickly conducted via the first and second metal layer into the chuck. Due to such insufficient heating during the sputtering procedure problems can occur in the process of forming backside contacts such as for example insufficient alloying of the sputtered metal with the silicon substrate.

Furthermore, the path length for leakage currents from the contacted second region to the silicon substrate can be reduced as the second metal 111 overlaps the silicon nitride layer 109 also in a region above the oxide layer 103 thereby laterally coming close to the surface of the silicon substrate 101 not covered by the oxide 105 or the silicon nitride layer 111. On the interface of the silicon nitride layer 109 with the environment leakage currents can appear.

A second conventional bond pad structure 201 is shown in FIG. 2. This alternative bond pad structure 201 differs from the previous bond pad structure 101 of FIG. 1 in that the second metal layer 213 is deposited directly on top of the first metal layer 209. Accordingly, instead of overlapping the silicon nitride layer as in the bond pad structure 101 of FIG. 1, the second metal layer is arranged under the silicon nitride layer 211. Thus, there is a reduced risk of scratches to be applied to the second metal layer 213 as this second metal layer does not form the most exposed layer of the bond pad structure 201. However, stacking complex metal stacks on top of each other requires high effort in edge design in order to avoid unfilled spaces when the first metal layer 209 is covered with another metal layer. Unfilled spaces could accumulate humidity resulting in life time failures like leakage currents in the final chip.

There may be a need for a bond pad structure and for a method of producing a bond pad structure avoiding the above-mentioned problems. Especially, there may be a need for a simplified bond pad structure wherein the manufacturability and reliability of a chip is improved.

SUMMARY OF THE INVENTION

This need may be met by the subject-matter according to the independent claims. Advantageous embodiments of the present invention are described in the dependent claims and in the following description.

According to a first aspect of the invention there is provided a bond pad structure comprising: a substrate having a surface to be electrically contacted; a first isolator layer contacting the surface of the substrate in a first region; a first metal layer contacting the surface of the substrate in a second region adjacent the first region and partly overlapping the first isolator layer; a second isolator layer at least partly overlapping the first isolator layer and the first metal layer; and a second metal layer at least partly overlapping the second isolator layer in the second region. Therein, a maximum thickness of the second metal layer perpendicular to the surface of the substrate is smaller than a maximum thickness of the first isolator layer perpendicular to the surface of the substrate.

In the following, features and advantages of the bond pad structure of the first aspect are given in more detail.

The substrate can be any substrate usable in the manufacture of semiconductor devices. For example, a silicon wafer or a substrate with a different semiconductor material can be used. The silicon wafer can have a thickness of approximately 500 μm. The substrate can include a plurality of regions having different doping densities and semiconductor types. For example, weak or highly doped n-type and p-type regions can be arranged within the substrate. The substrate can have a surface which is to be electrically contacted. Such surface can include a region which is highly doped. The established contact can be of an Ohmic type or a Schottky type.

The first isolator layer contacts at least parts of the surface to be electrically contacted of the substrate in a first region. The first isolator layer can comprise any dielectric material such as thermally grown oxide, deposited oxide or silicon nitrite ($Si_3N_4$). The first isolator layer can be provided directly adjacent to a highly doped area in the substrate or even slightly overlapping the highly doped area. The first isolator layer can have a homogeneous thickness in a direction perpendicular to the surface of the substrate.

The first metal layer can be deposited on top of the surface of the substrate in a second region adjacent to the first region and can furthermore be deposited on top of the first isolator layer in the first region. Accordingly, the first metal layer overlaps the first isolator layer at least partly. The first metal layer can comprise a single metal material or can be provided with a plurality of metal sub-layers of different metal materials stacked on top of each other. The materials for the first metal layer can be chosen such that an Ohmic contact or a Schottky contact is created with the underlying substrate. For example, the first metal layer can include a first sub-layer made with NiFe directly contacting the surface of the substrate, a second sub-layer made with WTi contacting the first sub-layer and a third sub-layer made with Al. Such layer structure can be provided to obtain a conventional Schottky contact with the underlying silicon substrate. The thickness of the first metal layer can be in the order of 1 to 2 μm and can be homogeneous in a direction perpendicular to the surface of the substrate.

The second isolator layer overlaps the first isolator layer at least partly. Preferably, the second isolator layer overlaps the first isolator layer completely. In other words, in a direction perpendicular to the substrate surface, the second isolator layer extends completely above the first region of the surface of the substrate. Furthermore, the second isolator layer also overlaps partly the first metal layer preferably in a peripheral region of the first metal layer.

For example, the second isolator layer can be arranged directly on top of the first isolator layer in a region where the first metal layer does not overlap the first isolator layer and can be arranged directly on top of the first metal layer in a region where the first metal layer overlaps the first isolator layer and can be furthermore arranged directly on top of the first metal layer in a peripheral region where the first metal layer directly contacts the silicon substrate.

The second isolator layer can be made with any dielectric material such as e.g. silicon nitride ($Si_3N_4$). It can be deposited by any conventional depositing method such as for example chemical vapour deposition, evaporation, sputtering, etc. The second isolator layer can have a high hardness so as to exhibit a high scratch resistance. The second isolator layer can have a thickness of 0.5 to 2.0 μm and can have preferably a thickness of about 1 μm.

The second metal layer can be deposited directly on top of the first metal layer and in a peripheral region at least partly overlaps the second isolator layer in the second region. The second metal layer can be deposited directly on top of the second isolator layer and can extend close to a border of the second region adjacent to the first region. The second metal layer can comprise a layer stack comprising e.g. a Ti sub-layer as contact metal to the first metal layer, a Ni sub-layer as a diffusion barrier and an Ag sub-layer. The second metal layer can be solderable using e.g. conventional Ag soft solder. Depending on the thickness of the Ag sub-layer, the Ag material of the sub-layer can serve as the soldering partner or, in case the thickness is thinner than about 0.5 μm, is incorporated into the soft solder material during soldering such that the Ni sub-layer serves as the soldering partner.

According to the invention the maximum thickness of the second metal layer is smaller than the maximum thickness of the first isolator layer. The thickness is measured in a direction perpendicular to the surface of the substrate. Preferably, both the second metal layer and the first isolator layer have a homogeneous thickness such that the maximum thickness corresponds to the average thickness.

With the above-described bond pad structure at least the second metal layer in the second region is arranged at a lower level than parts of the second isolator layer overlaying both the first metal layer and the first isolator layer. Herein, the "level" of a section of a layer shall be defined as the distance of a surface of the section away from the substrate to the surface of the substrate.

As the relatively soft second metal layer is located a lower level than the relatively hard second isolator layer it is protected against scratches for example during backside processing of the substrate when the finished bond pad structure is for example lying on a relatively hard chuck.

The described aspect of the invention is based on the idea that the metal stack of the second metal layer is laid on an overall lower dielectric layer stack as well as on the first metal layer. It is structured in a way that the upper wafer topography is still formed by the silicon nitride passivation layer serving as second isolator layer providing scratch protection. The thickness of the masking oxide serving as first isolator layer of an earlier process step can be varied to set a suitable distance between the second metal layer and the height of the surface of the passivating second isolator layer. The gap (distance between the surface level of the second metal layer and the most exposed surface level of the second isolator layer) must be large enough to avoid scratches on the metal. This is provided by a sufficient thickness of the first isolator layer. The metal on the edges of the second metal layer is lower than the second isolator layer by the thickness of the first isolator layer minus the thickness of the second metal layer. The main contact area of the second metal layer has an even lower topography. It is, by the thickness of the second isolator layer and the first isolator layer, lower than the edge of the die or chip.

According to a further aspect of the invention there is provided a method for producing a bond pad structure comprising the following steps: providing a substrate having a surface to be electrically contacted; depositing a first isolator layer contacting the surface of the substrate in a first region; depositing a first metal layer contacting the surface of the substrate in a second region adjacent the first region and the first metal layer partly overlapping the first isolator layer; depositing a second isolator layer at least partly overlapping the first isolator layer and the first metal layer; depositing a second metal layer at least partly overlapping the second isolator layer in the second region. Therein, a thickness of the second metal layer perpendicular to the surface of the substrate is smaller than a thickness of the first isolator layer perpendicular to the surface of the substrate.

According to a further aspect of the invention there is provided an integrated circuit element comprising a bond pad structure as described above.

In the following there will be described exemplary embodiments of the present invention with reference to a bond pad structure. It has to be pointed out that of course any combination of features relating to the different subject-matters is also possible.

According to an embodiment the second metal layer does not overlap the first isolator layer. In other words, the second metal layer does not laterally extend into the first region. The second isolator layer has its highest level in the first region where it overlaps the first isolator layer and the first metal layer. When the second metal layer overlaps the second isolator layer only in the second region but not in the first region, the silicon nitride layer in the first region forms the part of the bond pad structure having the highest level. As the second isolator layer usually has a high hardness, it can protect the second metal layer being at a lower level against scratches.

According to a further embodiment the maximum distance of a surface of the second metal layer away from the substrate to the surface of the substrate is smaller by a gap amount than the maximum distance of a surface of the second isolator layer away from the substrate to the surface of the substrate. In other words, the maximum level of the second metal layer is lower than the maximum level of the second isolator layer by the gap amount. Preferably, this gap amount is more than 0.3 μm. More preferably, the gap amount is larger than 0.5 μm and even more preferably larger than 1.0 μm. Assuming a homogeneous thickness for all layers of the bond pad structure, the gap amount can be expressed as the difference between the thickness of the first isolator layer and the thickness of the second metal layer. Usually, the larger the gap amount the higher the scratch protection can be.

In the context of the present description the term "overlapping" shall be interpreted such that a first layer overlapping a second layer is arranged above the second layer in a direction perpendicular to the substrate. However, the term "overlapping" shall not be interpreted in a limiting way. For example, the first layer does not need to directly contact the second layer but different structures or layers can be arranged between the first and the second layer. A similar definition applies to the terms of the "first region" and the "second region" of the surface of the substrate wherein these first and second regions are meant to comprise the entire vertical extension of a space above respective surface.

It has to be noted that embodiments of the invention are described with reference to different subject-matters. In particular, some embodiments are described with reference to apparatus type claims whereas other embodiments are described with reference to method type claims. However, a person skilled in the art will gather from the above and the following description that, unless other notified, in addition to any combination of features belonging to one type of subject-matter also any combination between features relating to different subject-matters, in particular between features of the apparatus type claims and features of the method type claims, is considered to be disclosed with this application.

BRIEF DESCRIPTION OF THE DRAWINGS

Further features and advantages of the present invention can be derived from the following description of preferred embodiments in conjunction with the appended figures.

FIG. 3 shows a bond pad structure in accordance with the present invention.

The illustration in the drawings is schematically. It is notified that in different figures, similar or identical elements are provided with the same reference signs or with reference signs, which are different from the corresponding reference signs only within the first digit.

DETAILED DESCRIPTION

Figure 1:
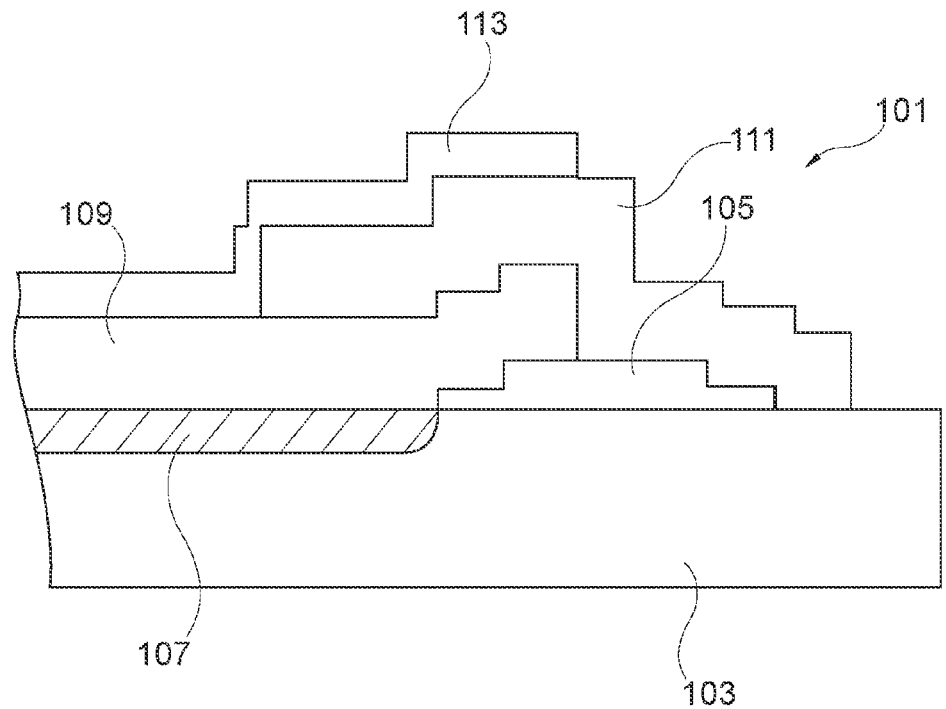
FIG. 1 shows a conventional bond pad structure.
Figure 2:
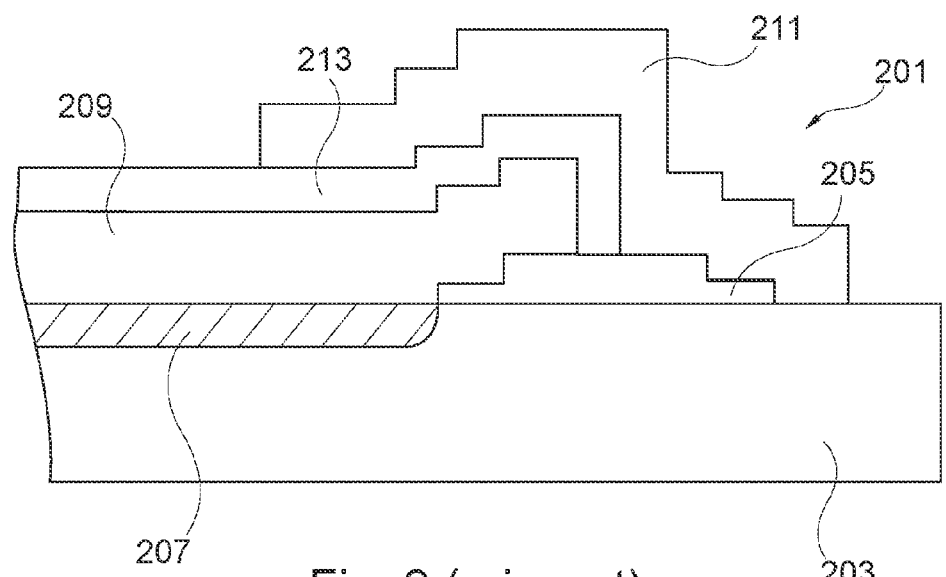
FIG. 2 shows another conventional bond pad structure.

FIG. 3 shows a bond pad structure 1 according to the present invention. On a surface 17 to be contacted of a silicon substrate 3 an oxide layer serving as first isolator layer 5 is provided on top of the surface 17 in a first region (a). The oxide layer has a maximum thickness $t_o$ of approximately 1 μm.

In a second region (b) a first metal layer 9 is provided on top of and directly contacting the surface 17 of the substrate 3. The first metal layer 9 comprises a metal layer stack including a first metal sub-layer with NiFe, a second metal sub-layer including WTi and a third metal sub-layer including Al. The first metal layer 9 forms a Schottky contact with the underlying substrate 3 having a highly doped area 7 in the second region (b).

The first metal layer 9 also extends into the first region of (a) where it overlaps the first isolator layer 5. The first isolator layer 5 acts as an insulation between the first metal layer 9 contacting the highly doped area 7 and the region of the substrate 3 laying underneath the first isolator layer.

A second isolator layer 11 comprising a silicon nitride layer extends along the periphery of the bond pad structure 1 such that it partly overlaps the first metal layer 9 and the first isolator layer 5 and contacts the substrate 3 in a third region (c) adjacent to the first region (a) and opposite to the second region (b).

A second metal layer 13 is arranged on top of the first metal layer 9. It comprises a layer stack comprising a Ti sub-layer as contact metal to the first metal layer 9, a Ni sub-layer as a diffusion barrier and an Ag sub-layer which can serve as a solderable layer and as a protection layer.

The second metal layer 13 partly overlaps the second isolator layer 11 in a peripheral region of the metal contact. However, the entire second metal layer lies completely within the second region (b) and does not overlap the first isolator layer 5 in the first region (a). The second isolator layer 13 has a thickness $t_i$ which is smaller than the thickness $t_o$ of the first isolator layer. Accordingly, even in a region where the second metal layer 13 lies on top of the second isolator layer 11, the level of the second metal layer 13 (i.e. the upper surface of the second metal layer 13 in FIG. 3) is lower than the maximum level of the second isolator layer 11 by a gap amount $t_g = t_o - t_i$. Accordingly, the second isolator layer 11 surrounding the metallization of the bond pad structure including the first and the second metal layers 9, 13 protects this metallization against scratches.

It is to be noted that in FIG. 3 only a section of the entire bond pad structure 1 is schematically shown. The entire bond pad structure can be symmetrical wherein a surface 19 where the second isolator layer 11 has its highest level completely surrounds the metal layers 9, 13. The arrow in FIG. 3 indicates the geometrical centre of the bond pad structure.

Finally, an exemplary method for producing a bond pad structure according to the invention is described in detail.

First, a silicon substrate 3 is provided. A first isolator layer of a thermal oxide is grown on the entire surface 17 of the substrate 3 to be contacted. In a next step, the oxide layer 5 is structured by photolithography such that it remains in the first region (a) and is etched away in the second region (b) and the third region (c) adjacent to the first region (a).

Subsequently, dopant ions are implanted into the second region (b) forming a highly doped area 7. In this implantation step, the oxide layer 5 having a sufficient thickness of about 1 μm serves as an implantation mask.

Then, a first metal layer 9 including several metal stack layers is deposited over the entire surface of the substrate 3 including the already deposited oxide layer 5. This first metal layer 9 is structured thereafter by photolithography such that it only remains in the second region (b) and partly overlaps the oxide layer 5 in the first region (a).

Next, a silicon nitride layer is deposited over the entire surface of the bond pad structure manufactured so far and is structured by photolithography. Finally, the second metal layer is deposited over the entire bond pad structure manufactured so far and is subsequently structured by photolithography. The respective photolithography steps are performed such that a bond pad structure as described above is obtained.

It should be noted that the term "comprising" does not exclude other elements or steps and the "a" or "an" does not exclude a plurality. Also elements described in association with different embodiments may be combined.

It should also be noted that reference signs in the claims should not be construed as limiting the scope of the claims.

In order to recapitulate the above-described embodiments of the present invention, one could state:

In this invention the upper metal layer is put on top of the passivation layer on some areas but below the surface level on other areas without using additional dielectric layers or mask steps. Therefore, it combines good manufacturability with the advantages of passivation and scratch protection and provides an improved reliability of the device.

List of Reference Signs:

| | |
|---|---|
| 1; 101; 201 | bond pad structure |
| 3; 103; 203 | substrate |
| 5; 105; 205 | first isolator layer |
| 7; 107; 207 | highly doped area |
| 9; 109; 209 | first metal layer |
| 11; 111; 211 | second isolator layer |
| 13; 113; 213 | second metal layer |
| 17; | surface of the substrate to be contacted |
| 19 | part of the second isolator layer having the highest level |
| (a) | first region |
| (b) | second region |
| (c) | third region |

The invention claimed is:

1. A bond pad structure, comprising:
a substrate having a surface to be electrically contacted;
a first isolator layer contacting the surface of the substrate in a first region;
a first metal layer contacting the surface of the substrate in a second region adjacent the first region and partly overlapping the first isolator layer;
a second isolator layer at least partly overlapping the first isolator layer and the first metal layer;
a second metal layer at least partly overlapping the second isolator layer in the second region;
wherein a maximum thickness of the second metal layer perpendicular to the surface of the substrate is smaller than a maximum thickness of the first isolator layer perpendicular to the surface of the substrate; and
wherein the maximum distance of a surface of the second metal layer away from the substrate to the surface of the substrate is smaller by a gap amount than the maximum distance of a surface of the second isolator layer away from the substrate to the surface of the substrate.

2. The bond pad structure according to claim 1, wherein the second metal layer does not overlap the first isolator layer.

3. The bond pad structure according to claim 1, wherein the gap amount is greater than about 0.3 µm.

4. The bond pad structure according to claim 1, wherein the second isolator layer contacts the surface of the substrate in a third region adjacent the first region.

5. The bond pad structure according to claim 1, wherein the first isolator layer is made with silicon oxide and the second isolator layer is made with silicon nitride.

6. The bond pad structure according to claim 1, wherein the first metal layer is made with a metal forming a Schottky contact with the substrate.

7. The bond pad structure according to claim 1, wherein the second metal layer is made with a solderable metal.

8. An integrated circuit element comprising a bond pad structure according to claim 1.

9. The bond pad structure according to claim 1, wherein the gap amount is greater than about 0.5 µm.

10. A method for producing a bond pad structure comprising:
providing a substrate having a surface to be electrically contacted;
depositing a first isolator layer contacting the surface of the substrate in a first region;
depositing a first metal layer contacting the surface of the substrate in a second region adjacent the first region and the first metal layer partly overlapping the first isolator layer;
depositing a second isolator layer at least partly overlapping the first isolator layer and the first metal layer;
depositing a second metal layer at least partly overlapping the second isolator layer in the second region;
wherein a thickness of the second metal layer perpendicular to the surface of the substrate is smaller than a thickness of the first isolator layer perpendicular to the surface of the substrate; and
wherein the maximum distance of a surface of the second metal layer away from the substrate to the surface of the substrate is smaller by a gap amount than the maximum distance of a surface of the second isolator layer away from the substrate to the surface of the substrate.

11. The method of claim 10, wherein the gap amount is greater than about 0.3 µm.

12. The method of claim 10, wherein the gap amount is greater than about 0.5 µm.

* * * * *